United States Patent

[11] 3,624,514

[72] Inventor Walter Putzer
Krefeld, Germany

[21] Appl. No. 1,717
[22] Filed Jan. 9, 1970
[45] Patented Nov. 30, 1971
[73] Assignee U.S. Philips Corporation
New York, N.Y.

[54] TUNING CIRCUIT HAVING COMMON TUNING ELEMENT FOR THREE FREQUENCY RANGES AND SELF-OSCILLATING MIXER USING SAME
7 Claims, 5 Drawing Figs.

[52] U.S. Cl. .......... 325/440, 325/451, 325/459, 325/464, 334/15, 334/45
[51] Int. Cl. .......... H04b 1/28, H03j 3/18
[50] Field of Search .......... 334/1, 15, 41, 45, 78; 331/177 R, 177 V, 179; 325/459, 440, 464, 451

[56] References Cited

UNITED STATES PATENTS

| | | | |
|---|---|---|---|
| 3,204,198 | 8/1965 | Bachnick .......... | 334/15 X |
| 3,324,412 | 6/1967 | Boomgaard .......... | 334/41 X |
| 3,391,347 | 7/1968 | Bosse et al. .......... | 334/15 X |

*Primary Examiner*—Herman Karl Saalbach
*Assistant Examiner*—Paul L. Gensler
*Attorney*—Frank R. Trifari

ABSTRACT: A tuning circuit for the reception of signals from three spaced frequency ranges, comprising parallel resonant circuits having at least one common tuning element for all the frequency ranges. The tuning of the resonant circuits is varied by the common tuning element to produce resonance in only one of the frequency ranges at a time. Signals within the frequency ranges of the other circuits not being used are rejected.

INVENTOR.
WALTER PUTZER
BY
AGENT

INVENTOR.
WALTER PUTZER

BY

AGENT

TUNING CIRCUIT HAVING COMMON TUNING ELEMENT FOR THREE FREQUENCY RANGES AND SELF-OSCILLATING MIXER USING SAME

The invention relates to a tuning circuit which, without mechanic or electronic switching, can be tuned to frequencies of various spaced frequency ranges, particularly frequencies of the television VHF range and optionally the UHF range.

A self-oscillating mixer stage for the reception of signals from the VHF and UHF ranges without switching is already known. The output circuit of this mixer stage comprises a network which has two parallel resonances one of which lies in the UHF range and the other lies in the VHF range. To this end the oscillator circuit for UHF, which consists of a coaxial line resonator having an inner conductor and a variable capacitor, is connected to the IF circuit through an inductor which is active as a choke coil for the UHF and a proportionally large feed-through capacitor of 100 pf. The feed-through capacitor and the inner conductor constitute a short circuit for VHF frequencies so that the VHF circuit is formed by the variable capacitor and the UHF-choke coil.

A drawback of this network is that two parallel resonances are always available so that this network is unsuitable, for example, as a band-pass filter. In addition the currently commercially available capacity diodes do not make it possible to tune the entire VHF range (48,25 to 22.75 MHz.) without switching because a capacitance variation (ratio of the capacitance at low and high tuning voltages) of approximately 22:1 is required for this purpose.

Starting from such a network for the reception of the signals from various spaced frequency ranges and various parallel resonances, which network can be tuned by a capacity diode, the tuning circuit according to the invention is characterized in that signals from the frequency ranges located therebetween are rejected by fixed value filters and that each parallel resonance is active in only one of the frequency ranges to be used for reception and that only one parallel resonance falls in one of the frequency ranges to be used for reception at each tuning.

In order that the invention may be readily carried into effect, an embodiment thereof will now be described in detail, by way of example with reference to the accompanying diagrammatic drawings, in which.

Figure 1:
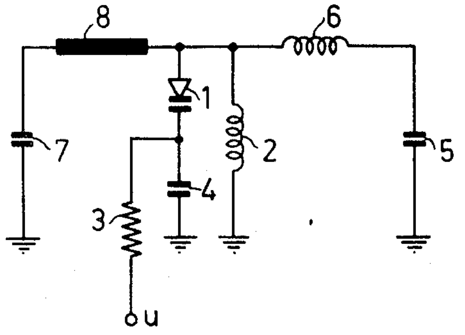
FIG. 1 shows a tuning network according to the invention.

FIGURE 1 shows a tuning network for the reception of signals from the VHF ranges I (48–67 MHz.) and III (175–222 MHz.) and for the UHF ranges IV/V (470–860 MHz.). The tuning network for the three interconnected reception ranges has three parallel resonances. These parallel resonances are varied by a common tuning element and this in such a manner that always only one resonance is located in one reception range and the two other resonances are located in the frequency ranges therebetween, where they can be rendered inactive by fixed value filters.

The tuning circuit includes a capacity diode 1 as a tuning element, the cathode of which is substantially connected to ground through a capacitor 4 of, for example, 100 pf. for the relevant frequencies and which is controlled through a resistor 3 by the positive tuning voltage. Connected in parallel with the capacity diode with respect to alternating current are an inductor 2, the series arrangement of a capacitor 5 of 3.9 pf. and an inductor 6 and the series arrangement of a capacitor 7 of, for example, 6.8 pf. and an inner conductor 8 of a coaxial line resonator not further shown which conductor is active as an inductor for the UHF.

The capacitors 5 and 7 are substantially connected parallel to the capacity diode 1 for proportionally low frequencies; and the coil 2 is therefore proportioned in such a manner that it is in resonance (first parallel resonance) with this parallel arrangement at the lowest frequency of the range I and at the smallest tuning voltage U.

For frequencies above range I, the series arrangement of the inductor 6 and the capacitor 5 becomes inductively active, while the resonant circuit 1, 2, 7 acts as a capacitor. By appropriate proportioning of the inductor 6 it is achieved that the second parallel resonance produced thereby is located at the lowest frequency of the range III when the first parallel resonance coincides with or lies above the highest frequency of the range I.

For frequencies above range III the series arrangement of capacitor 7 and the coaxial line resonator inductor 8 is inductive, whereas the rest of the network is capacitive. Thus a third parallel resonance is obtained which in case of appropriate proportioning of the coaxial line resonator inductor is located at the lowest frequency of the UHF range when the second parallel resonance has reached or passed the upper frequency end of the VHF range III.

Figure 2:
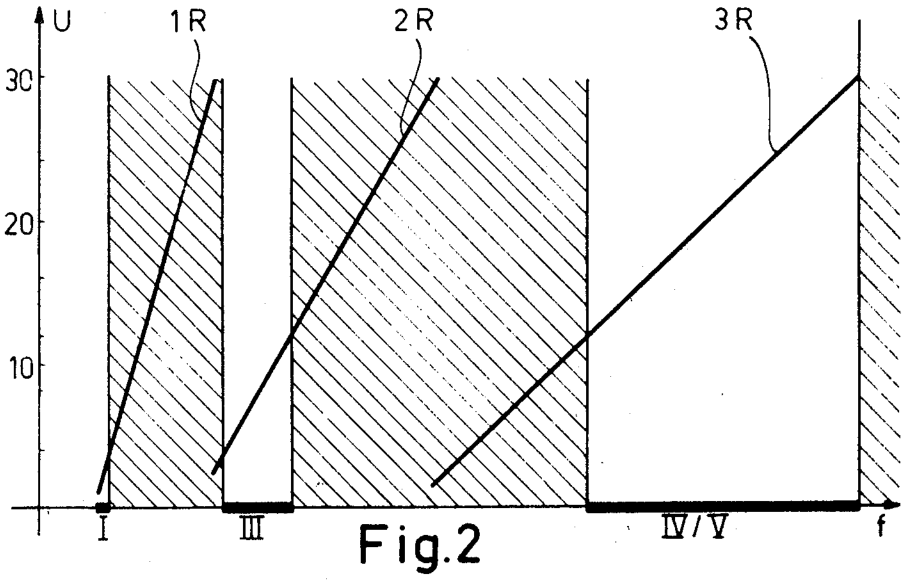
FIG. 2 shows the dependence of the parallel resonant frequencies on the tuning voltage in the tuning network according to the invention.

The dependence of the three parallel resonant frequencies on the tuning voltage is shown in FIG. 2. The first parallel resonance 1R commences at the lowest frequency of the range I (tuning voltage 2 v.) and reaches the upper end of this range of this range at a tuning voltage of 6 v. For a tuning voltage of $u > 6$ v. the second parallel resonance 2R is located at the lower frequency end of the range III whose upper end is reached at a tuning voltage of approximately 12 v. The third parallel resonance 3R reaches the lower end of the range IV/V at $u > 12$ v. and the upper end at 30 v.

In this manner the three reception ranges are successively passed through when tuning the capacity diode. Then only one of the three parallel resonances each time falls in one reception range; the two other resonances are located in frequency ranges therebetween and are suppressed by fixed value filters (not further shown) before of after the tuning network.

The required capacitance variation is proportionally small because a parallel resonance is available for each reception range so that no capacitance variation is required for passing through the frequency ranges located between the reception ranges. A tuning network according to the invention for the VHF ranges I and III accordingly has only two parallel resonances each of which successively pass through reception range.

It is alternatively possible to pass through the range III (or the range V) first and then through the range I when the tuning voltage increases (equivalent to decreasing capacitance). A circuit arrangement in which in accordance with FIG. 2 the reception frequencies are passed through in an increasing manner, that is to say, first the reception range of the lowest frequencies and so on has, however, generally better properties.

In the diagrammatic representation of FIG. 2, the parallel resonant frequencies are drawn to be linearly dependent on the tuning voltage. Actually, curvatures of the characteristic curves having a favorable effect are formed particularly in the boundary ranges. In fact, the capacitors 5 and 7 are connected parallel to the capacity diode 1 in the range I, so that a slower shift of the first resonant frequency results in case of variations of these capacitors at small capacitances and at a high tuning voltage, which resonant frequency therefore does not increase to such a great extent in the range of the high tuning voltages as is shown in FIG. 1. On the other hand, the capacitor 5 is arranged in series with the capacity diode for the second parallel resonance and limits the effect of this diode at low tuning voltages. The second resonance thus commences at frequencies which are higher than those shown in the drawing, but still below the range III.

Figure 3:
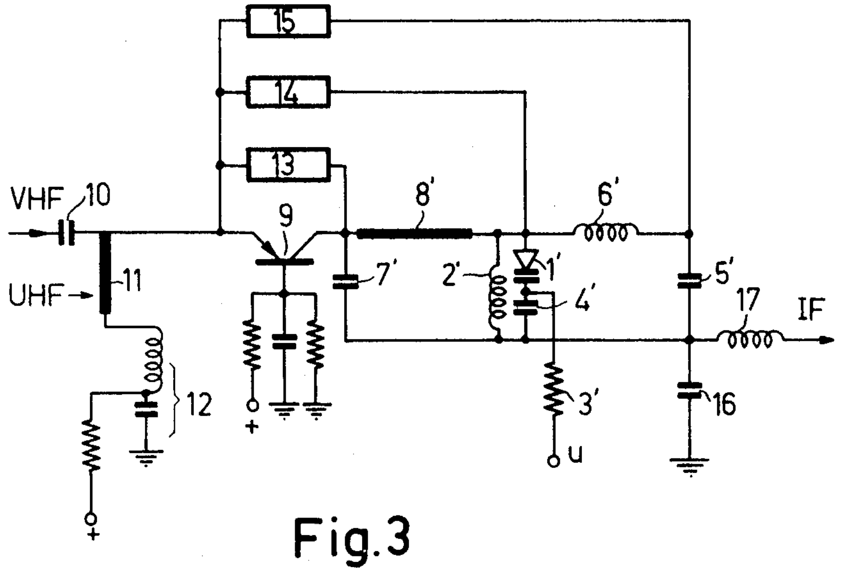
FIG. 3 shows a self-oscillating mixer stage including the tuning network according to the invention.

Figure 3 shows the use of the invention in a self-oscillating mixer stage. The tuning network 1'...8' is located in the collector circuit of a transistor 9 arranged in common base configuration. The VHF signals are coupled to the emitter through a capacitor 10 while the UHF signals are applied to the emitter through a coupling loop 11 whose end remote from the emitter is connected to ground through an IF wave trap 12.

The feedback of the collector to the emitter is effected through filters 13, 14, 15, which are connected to the points of the tuning network 1'...8' at which the amplitude of each parallel resonance has a maximum value. Consequently, the junction of the capacity diode 1' and the inductor 2' is connected through a low-pass filter 14 to the emitter which suppresses all oscillator frequencies above the range I. The second resonance voltage is tapped from the junction of the capacitor 5' and the inductor 6'—because the amplitude at that junction is greater than that across the circuit 1', 2' which at these frequencies has a proportionally small capacitive reactance — and is fed back to the emitter through a band-pass filter 15 which only passes oscillator frequencies of the range III. Finally, the junction of the capacitor 7' and the coaxial line resonator inductor 8' connected to the collector of the transistor 9 is connected to the emitter through a high pass filter 13 which only passes the oscillator frequencies of the range IV/V.

The filters 13, 14, 15 must be unable to pass direct current in order that collector and emitter are DC separated; they must bring about the phase shift which is required for the feedback and in addition they must have a high input resistance in the stop band in order that the tuning network 1'...8' is not influenced by these filters.

The elements 1'...8' are not proportioned in the same manner as those in FIG. 1, because the tuning network is always tuned to the oscillator frequency which, as is known, is located about the intermediate frequency above the actual reception frequency.

The intermediate frequency voltage is derived from the capacitor 16 of 3.9 pf. one end of which is connected to ground and the other end of which is connected to the low end of the tuning network 1'...8' and this voltage is applied through a choke coil 17 to the IF filter not further shown which in addition connects the collector of the transistor 9 to ground with respect to direct current.

Figure 4:
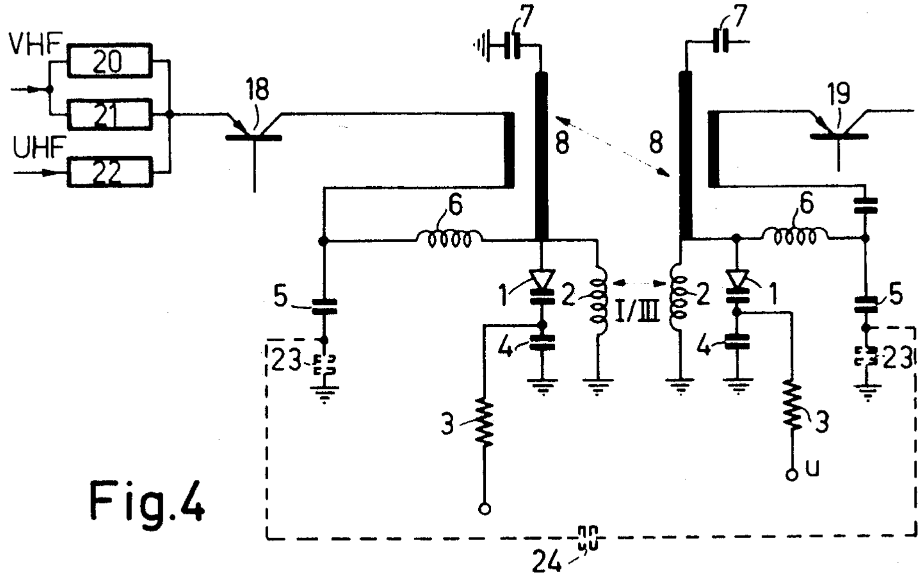
FIG. 4 shows a band-pass filter stage.

FIG. 4 shows a band-pass filter stage employing a band-pass filter according to the invention. The collector of a transistor 18 is connected to the junction of the inductor 6 and the capacitor 5 of the tuning network (1...8). The collector line forms a coupling loop which is active for UHF and which has a fixed coupling with the coaxial line resonator inductor 8. The subsequent stage employing the transistor 19, for example, a self-oscillating mixer stage according to FIG. 3, has a corresponding tuning network at its input for which consequently the same reference numerals are used. The two stages 18 and 19 are proportionally loosely coupled magnetically through the inductors 2 for the VHF range. The UHF signal is transmitted through the proportionally loosely magnetically coupled coaxial line resonator inductors 8. A different coupling is possible for ranges I and III when also the inductors 6 are magnetically coupled together or when — as shown in a broken line— an additional low end coupling is introduced by the capacitors 23 and the capacitor 24 located in the shunt circuit.

In this circuit arrangement the filters for suppressing the unwanted frequencies are provided at the input of the transistor 18. The VHF signal is then passed to the emitter of the transistor 18 either through the lowpass filter 20 whose highest cutoff frequency coincides with the highest frequency of range I, or through the band-pass filter 21 which only passes signals from the range III. Signals from the UHF range are applied to the input of the transistor 18 through a high pass filter 22 which rejects all signals having frequencies below the lower frequency of the range IV/V.

Figure 5:
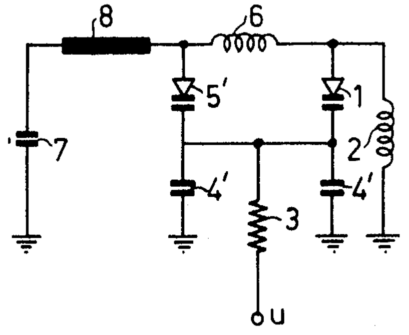
FIG. 5 shows a further embodiment of the invention.

A drawback of this circuit arrangement is that the matching of the high impedance transistor output to the tuning network in the VHF range is greatly influenced by the capacitance of the capacity diode 1. This drawback may be obviated and a substantially constant matching which is independent of the diode capacitance can be achieved when according to a further embodiment of the invention the capacitor 5 is replaced by a second capacity diode 51 which is controlled by the tuning voltage as is shown in FIG. 5.

What is claimed is:

1. A tuning circuit for the reception of signals having frequency values in three spaced frequency ranges, comprising at least one common tuning element for all of said three spaced frequency ranges, means for varying the capacitance of said element, and a plurality of networks in parallel with said element for producing parallel resonance for signals within each frequency range respectively, said parallel resonances being varied over said frequency ranges by said tuning element to provide only one active parallel resonance for signals to be used for reception in each frequency range.

2. A tuning circuit as claimed in claim 1 wherein said plurality of networks comprise first inductive means in parallel with said element to produce a first parallel resonance for signals within a first frequency range, a first series resonant circuit in parallel with said element to produce a second parallel resonance for signals within a second frequency range, said first series resonant circuit comprising a second inductive means and a first capacitor, and a second series resonant circuit in parallel with said element to produce a third parallel resonance for signals within a third frequency range, said second series resonant circuit comprising a coaxial line resonator and a second capacitor.

3. A tuning circuit as claimed in claim 2 wherein said tuning element, said first inductive means and said first series resonant circuit produce first and second parallel resonances varied in the same sense, said first parallel resonance having a frequency coinciding with the highest frequency of the first range when said second parallel resonance has a frequency lying below or about the lower frequency of said second range.

4. A tuning circuit as claimed in claim 2 wherein said second series resonant circuit further produces said third parallel resonance at the lowest frequency of the third range at which the second parallel resonance lies at or above the highest frequency of the second range.

5. A tuning circuit as claimed in claim 2, wherein said tuning element comprises a capacity diode, said first inductive means being proportioned in such a manner to produce said first parallel resonance at the lowest frequency of the first range for the smallest magnitude of tuning voltage, said first series circuit together with said capacity diode and said first inductive means forming said second parallel resonance at that magnitude of the tuning voltage corresponding to the lowest frequency of said second range of which the first parallel resonance lies about or above the highest frequency of said first range.

6. A tuning circuit as claimed in claim 5 wherein said capacitor is formed by a further capacity diode influenced in the same sense by the tuning voltage as the first mentioned capacity diode.

7. A self-oscillating mixer comprising a transistor to produce signals at various spaced frequency ranges, input means for received signals, a tuning network in the collector circuit of said transistor comprising a tuning element, means for varying the capacitance of said element by the application of tuning voltages thereto, first inductive means in parallel with said element to produce a first parallel resonance for IF signals within a first frequency range, a first series resonant circuit in parallel with said element to produce a second parallel resonance for IF signals within a second frequency range, said first series resonant circuit comprising a second inductive means and a first capacitor and a second series resonant circuit in parallel with said element to produce a third parallel resonance for IF signals within a third frequency range, said second series resonant circuit comprising a coaxial line resonator and a second capacitor, the collector electrode of said transistor being connected between said coaxial line resonator and said second capacitor, first filter means connected to said element to pass signals within said first frequency range, second filter means connected between said second inductive means and said first capacitor to pass signals within said second frequency range, and third filter means connected to the collector electrode of said transistor oscillator, said first, second and third filter means connected to the emitter electrode of said transistor oscillator to feedback the maximum amplitude of the first, second and third resonance, respectfully, said first second and third parallel resonances being varied over said first, second and third frequency ranges respectively by said tuning voltages to provide only one active parallel resonance for intermediate signals to be used for reception in each frequency range, said filtering means suppressing IF signals from frequency ranges not being used for reception.

* * * * *